United States Patent
Yeh

(10) Patent No.: US 7,768,864 B2
(45) Date of Patent: Aug. 3, 2010

(54) NON-VOLATILE MEMORY DEVICE CAPABLE OF SUPPLYING POWER

(75) Inventor: Chwei-Jing Yeh, Hsinchu County (TW)

(73) Assignee: Ritek Corporation, Hsinchu (TW)

( * ) Notice: Subject to any disclaimer, the term of this patent is extended or adjusted under 35 U.S.C. 154(b) by 140 days.

(21) Appl. No.: 12/212,960

(22) Filed: Sep. 18, 2008

(65) Prior Publication Data

US 2010/0027365 A1    Feb. 4, 2010

(30) Foreign Application Priority Data

Aug. 4, 2008    (TW) ............................... 97213913 U

(51) Int. Cl.
*G11C 7/00* (2006.01)
(52) U.S. Cl. .................................. 365/226; 365/185.17
(58) Field of Classification Search ............ 365/185.17, 365/226
See application file for complete search history.

(56) References Cited

U.S. PATENT DOCUMENTS 5,519,663 A * 5/1996 Harper et al. ................ 365/229

* cited by examiner

*Primary Examiner*—Hoai V Ho
(74) *Attorney, Agent, or Firm*—J.C. Patents

(57) ABSTRACT

A non-volatile memory device capable of supplying power is provided. The non-volatile memory device includes an electrical storage device for supplying a stored power, a charging control circuit coupled to the electrical storage device, a non-volatile memory, an input/output (I/O) interface, and a power control circuit. The I/O interface connects an electronic apparatus for transmitting an external power output from the electronic apparatus to the non-volatile memory and the charging control circuit, such that the charging control circuit could control a charging current and a charging voltage of the electrical storage device. The power control circuit converts the stored power into a backup power, and monitors whether a voltage value of the external power is less than a predetermined value. If the result is positive, the power control circuit controls the charging control circuit to stop charging the electrical storage device, and outputs the backup power through the I/O interface.

28 Claims, 4 Drawing Sheets

NON-VOLATILE MEMORY DEVICE CAPABLE OF SUPPLYING POWER

CROSS-REFERENCE TO RELATED APPLICATION

This application claims the priority benefit of Taiwan application serial no. 97213913, filed on Aug. 4, 2008. The entirety of the above-mentioned patent application is hereby incorporated by reference herein and made a part of specification.

BACKGROUND OF THE INVENTION

1. Field of the Invention

The present invention relates to a non-volatile memory device. More particularly, the present invention relates to a non-volatile memory device capable of supplying power.

2. Description of Related Art

With development of technology, people increasingly depend on electronic devices. The electronic devices are widely used all around, and become indispensable in people's daily life.

For example, communication products such as mobile phones and personal digital assistants (PDA), etc. and audio-visual products such as MPEG audio layer 3 (MP3) walkmans and digital cameras, etc. are flooded in the market with a general development trend of lightness, slimness, shortness, smallness, humanity and better functions, and almost everyone owns at least one of the above electronic devices.

Though these portable electronic devices have a plenty of different power-saving designs for prolonging a utilization time thereof, since most of such electronic devices are powered by internal batteries, and charge capacities of the internal batteries are limited, power of the electronic devices is often used out during operations thereof, which can cause a utilization inconvenience.

SUMMARY OF THE INVENTION

The present invention is directed to a non-volatile memory device capable of supplying power, which can supply power to an electronic device.

The present invention provides a non-volatile memory device capable of supplying power. The non-volatile memory device includes a non-volatile memory, an electrical storage device, a charging control circuit, an input/output (I/O) interface and a power control circuit. The electrical storage device is used for supplying a stored power. The charging control circuit is coupled to the electrical storage device. The I/O interface connects an electronic apparatus for transmitting data and transmitting an external power output from the electronic apparatus to the non-volatile memory and the charging control circuit, such that the charging control circuit could control a charging current and a charging voltage of the electrical storage device. The power control circuit converts the stored power into a backup power, and monitors whether or not a voltage value of the external power is less than a predetermined value. If the voltage value of the external power is less than the predetermined value, the power control circuit controls the charging control circuit to stop charging the electrical storage device, and outputs the backup power through the I/O interface.

The present invention provides a non-volatile memory device capable of supplying power. The non-volatile memory device includes a non-volatile memory, an electrical storage device, a charging control circuit, an I/O interface and a power control circuit. The electrical storage device is used for supplying a stored power. The charging control circuit is coupled to the electrical storage device. The I/O interface connects an electronic apparatus for transmitting data and transmitting an external power output from the electronic apparatus to the non-volatile memory and the charging control circuit, such that the charging control circuit could control a charging current and a charging voltage of the electrical storage device. The power control circuit converts the stored power into a backup power. Wherein, the charging control circuit further monitors whether or not a voltage value of the external power is less than a predetermined value, and if the voltage value of the external power is less than the predetermined value, the charging control circuit stops charging the electrical storage device, and controls the power control circuit to output the backup power through the I/O interface.

According to an embodiment of the present invention, the power control circuit includes a power conversion circuit and an output control circuit. The power conversion circuit is used for converting the stored power into the backup power. The output control circuit is used for receiving the backup power and monitoring whether the voltage value of the external power is less than the predetermined value, and if the voltage value of the external power is less than the predetermined value, the output control circuit controls the charging control circuit to stop charging the electrical storage device, and outputs the backup power through the I/O interface.

According to another embodiment of the present invention, the power control circuit includes a power conversion circuit and an output control circuit. The power conversion circuit is used for converting the stored power into the backup power. The output control circuit is used for receiving the backup power, and is controlled by the charging control circuit, so as to output the backup power through the I/O interface when the voltage value of the external power is less than the predetermined value.

According to an embodiment of the present invention, the electrical storage device is implemented by an ultracapacitor.

According to an embodiment of the present invention, the non-volatile memory is implemented by a NAND flash memory, or a NOR flash memory.

According to an embodiment of the present invention, the I/O interface is implemented by a universal serial bus (USB) interface, a personal computer memory card international association (PCMCIA) interface, a compact flash (CF) card interface, a secure digital (SD) memory card interface, or a multimedia memory card (MMC) interface.

In the present invention, the electrical storage device used for supplying a stored power, the charging control circuit and the power control circuit are applied in the non-volatile memory device, and the I/O interface can transmit the external power output from the electronic apparatus to the charging control circuit, so that the charging control circuit could control the charging current and the charging voltage of the electrical storage device. The power control circuit is used for converting the stored power in to the backup power. Moreover, the charging control circuit and the power control circuit are utilized for controlling charging/discharging of the electrical storage device, and monitoring whether the voltage value of the external power is less than the predetermined value, and once the voltage value of the external power is less than the predetermined value, the charging control circuit stops charging the electrical storage device, and the power control circuit outputs the backup power through the I/O interface, so as to supply power to the external electronic apparatus.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The commonly used portable memory devices such as memory cards, USB flash disks, etc. are generated applied to various electronic devices, and the portable memory device usually takes a non-volatile memory as a data storage medium for maintaining integrity of data when power is not supplied. Therefore, the present invention provides a non-volatile memory capable of supplying power to serve as a backup power supplying device, so as to charge or assist supplying power to an external electronic apparatus.

In the present invention, since a design consideration is to utilize the non-volatile memory device as a tool to charge or assist supplying power to the electronic apparatus, in the following embodiment, only content relates to such design is described, and contents relates to a controller used for controlling data accessing within the non-volatile memory device, and a method thereof for controlling data transmission are not referred. Embodiments are provided below for describing the present invention.

Figure 1:
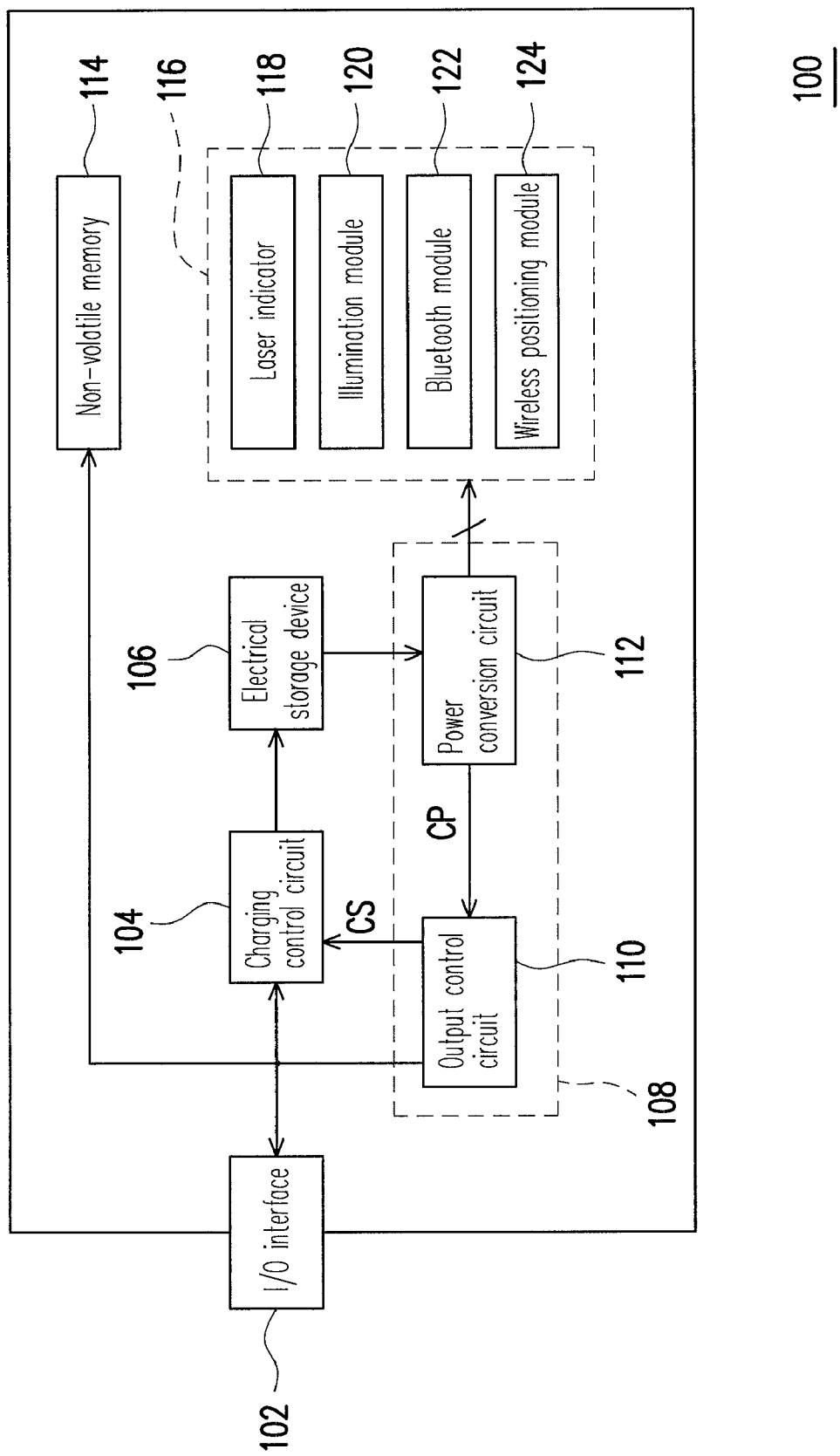
FIG. 1 is a diagram illustrating a non-volatile memory device capable of supplying power according to an embodiment of the present invention.

FIG. 1 is a diagram illustrating a non-volatile memory device capable of supplying power according to an embodiment of the present invention. Referring to FIG. 1, the non-volatile memory device 100 mainly includes an I/O interface 102, a charging control circuit 104, an electrical storage device 106, a power control circuit 108, a non-volatile memory 114 and an internal power-consuming device 116. The internal power-consuming device 116 is an additional device in the non-volatile memory device 100 that consumes power, for example, a laser indicator 118, an illumination module 120, a bluetooth module 122 or a wireless positioning module 124.

The charging control circuit 104 is coupled to the electrical storage device 106, and the electrical storage device 106 is used for providing a stored power. Moreover, the I/O interface 102 connects to an electronic apparatus (not shown) for transmitting data and transmitting an external power output from the electronic apparatus to the non-volatile memory 114 and the charging control circuit 104, such that the charging control circuit 104 could control a charging current and a charging voltage of the electrical storage device 106. The external power is an operating power supplied to the non-volatile memory device by a general electronic apparatus, such that mentioned general electronic apparatus can access data with the non-volatile memory device. Since a general I/O interface has at least one data transmission pin, one positive power pin and one negative power pin, the above external power can be transmitted to internal of the non-volatile memory device via the positive power pin and the negative power pin.

The power control circuit 108 is coupled to the I/O interface 102, the charging control circuit 104, the electrical storage device 106, the non-volatile memory device 114 and the internal power-consuming device 116, and is used for converting the stored power into a backup power CP, and converting the stored power into power required by the additional devices within the internal power-consuming device 116. Moreover, the power control circuit 108 not only transmits the power required by the additional devices to the corresponding additional device, but also monitors whether or not a voltage value of the external power is less than a predetermined value. If the voltage value of the external power is less than the predetermined value, the power control circuit 108 outputs a control signal CS to the charging control circuit 104 for controlling the charging circuit 104 to stop charging the electrical storage device 106, and outputs the backup power CP through the I/O interface 102. Certainly, the backup power CP is also transmitted to external of the non-volatile memory device via the positive power pin and the negative power pin of the I/O interface.

In the present embodiment, the power control circuit 108 includes an output control circuit 110 and a power conversion circuit 112. The power conversion circuit 112 is used for converting the stored power into the backup power CP, and converting the stored power into power required by the additional devices within the internal power-consuming device 116. The output control circuit 110 receives the backup power CP and monitors whether or not the voltage value of the external power is less than the predetermined value. If the voltage value of the external power is less than the predetermined value, the output control circuit 110 outputs the control signal CS to the charging control circuit 104 for controlling the charging circuit 104 to stop charging the electrical storage device 106, and outputs the backup power CP through the I/O interface 102.

The power conversion circuit 112 can be implemented by a DC/DC converter, which is used for converting a voltage of the stored power into working voltages required by the additional devices within the internal power-consuming device 116 to serve as the power of the additional devices, and is used for converting the voltage of the stored power into a supply voltage required by the electronic apparatus to serve as the backup power CP of the electronic apparatus. The non-volatile memory 114 can be implemented by a flash memory, for example a NAND flash memory or a NOR flash memory. The electrical storage device 106 can be implemented by a rechargeable battery.

Considering that the non-volatile memory device 100 is used as a tool to charge or assist supplying power to the electronic apparatus, a charge capacity of the electrical storage device 106 has to be great enough. Therefore, the electrical storage device 106 is recommended to be implemented by a capacitor cell, and a preferred implementing method thereof is to implement the electrical storage device 106 by an ultracapacitor. This is because the ultracapacitor not only has a small size, but also has a capacity greater than that of a general capacitor cell, and the capacity thereof is more than triple compared to a capacity of a lithium battery of a current mobile phone, so that it is suitable to serve as the electrical storage device 106.

In case of a such design, the non-volatile memory device 100 is capable of supplying power to itself, and as long as the electrical storage device 106 of the non-volatile memory device 100 is fully pre-charged, when the power stored within an internal battery of the electronic apparatus is used out, the non-volatile memory device 100 can immediately supply the backup power CP to the electronic apparatus, so as to assist supplying power to the electronic apparatus and achieve a power supply function.

Further, the output control circuit 110 can be designed to stabilize the voltage and the current of the backup power CP, so that the charging voltage and the charging current of the electronic apparatus can be stabilized. Moreover, the charging control circuit 104 can be designed to stop charging the electrical storage device 106 after the electrical storage device 106 is fully charged, or the charging control circuit 104 can be designed to have an over current protection function. Certainly, elements within the internal power-consuming device 116 can be increased or decreased according to an actual design requirement, as long as all of the elements within the internal power-consuming device 116 are coupled to the power conversion circuit 112, and the power required by the elements are all obtained by converting the stored power via the power conversion circuit 112.

Moreover, those skilled in the art should understand that the I/O interface 102 can be implemented by a USB interface, a PCMCIA interface, a CF card interface, a SD memory card interface, or a MMC interface, which is not limited by the present invention.

Figure 2:
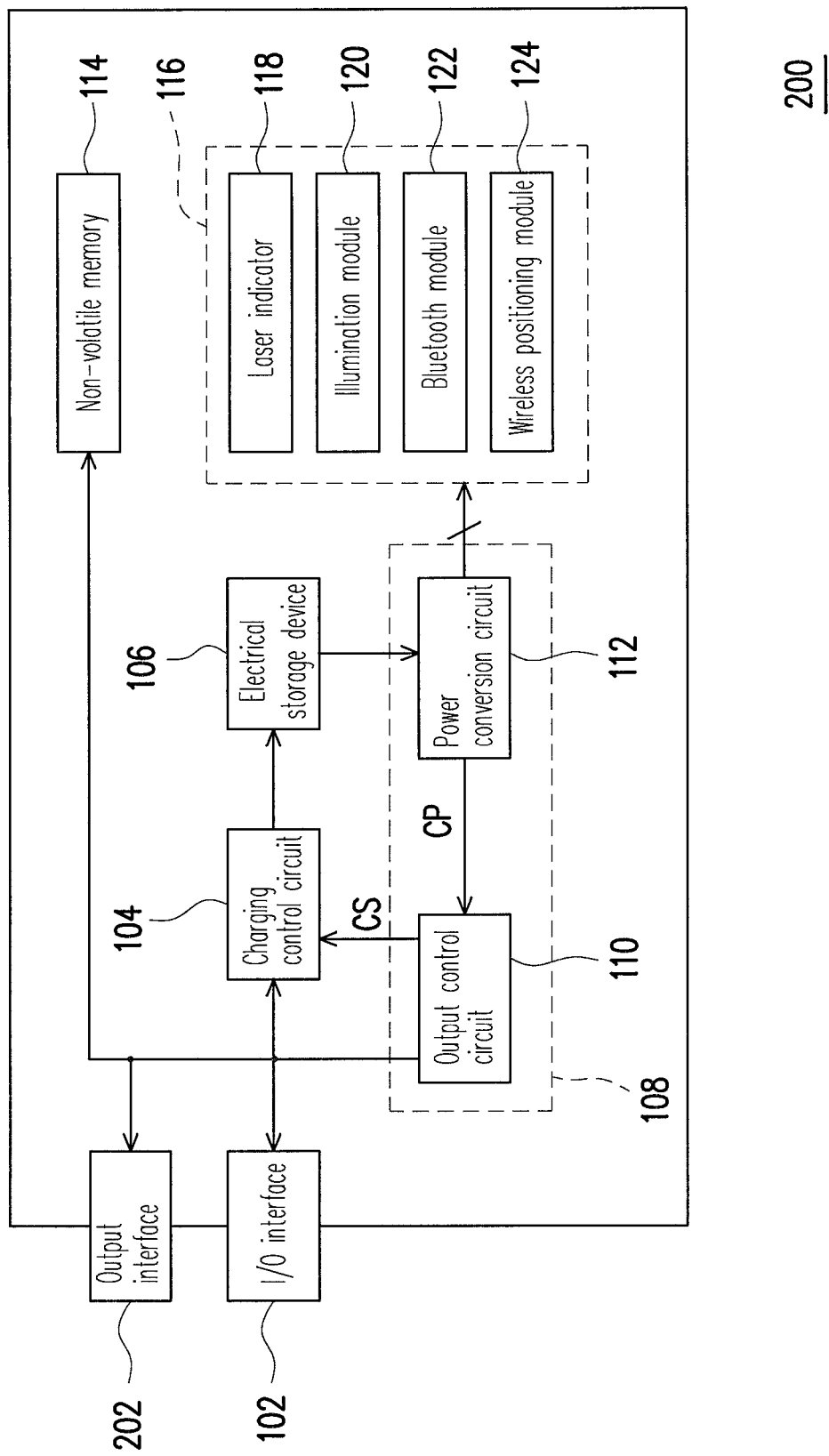
FIG. 2 is a diagram illustrating a non-volatile memory device capable of supplying power according to another embodiment of the present invention.

Considering that the non-volatile memory device 100 can be used for charging two different electronic apparatus, the present invention provides another non-volatile memory device, as shown in FIG. 2. FIG. 2 is a diagram illustrating a non-volatile memory device capable of supplying power according to another embodiment of the present invention. Referring to FIG. 1 and FIG. 2, a difference between the two non-volatile memory devices is that the non-volatile memory device 200 of FIG. 2 has an additional output interface 202. The output interface 202 is coupled to the I/O interface 102, the charging control circuit 104, the non-volatile memory 114 and the output control circuit 110, and is used for connecting another electronic apparatus (not shown), so as to output the backup power CP to the such electronic apparatus.

For example, if the I/O interface 102 of the non-volatile memory device 200 is implemented by a USB interface, and the output interface 202 is implemented by a charging port connector of a mobile phone, the non-volatile memory device 200 then can be plugged into a USB port of a computer host via the I/O interface 102, so that the computer host can charge the electrical storage device 106, and when the mobile phone is out of power, the non-volatile memory device 200 can be connected to the mobile phone via the output interface 202, so as to supply power to the mobile phone.

Figure 3:
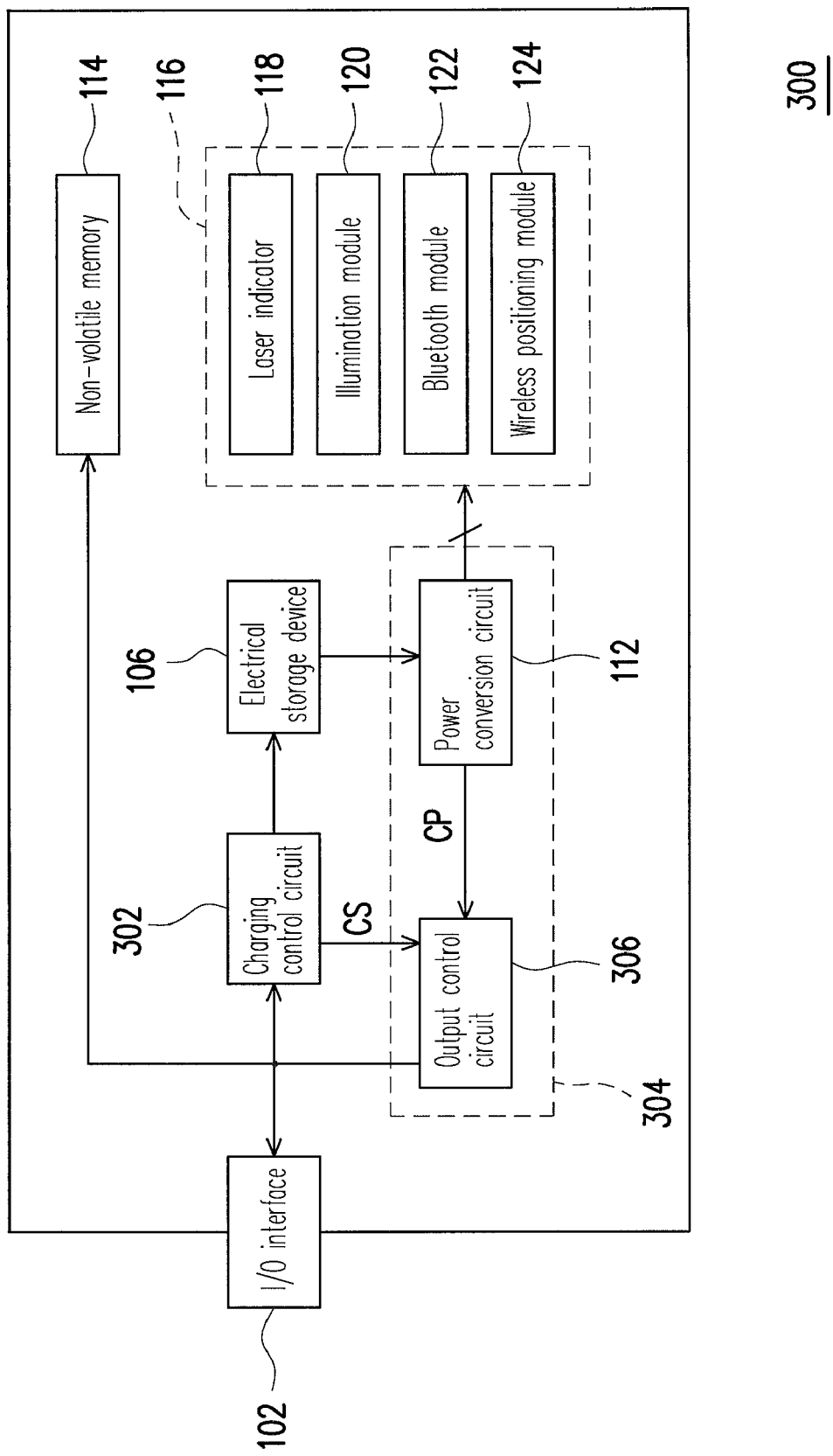
FIG. 3 is a diagram illustrating a non-volatile memory device capable of supplying power according to still another embodiment of the present invention.

FIG. 3 is a diagram illustrating a non-volatile memory device capable of supplying power according to still another embodiment of the present invention. Referring to FIG. 1 and FIG. 3, a difference between the two non-volatile memory devices is that operations of the charging control circuit and the power control circuit are different. In the non-volatile memory device 300 of FIG. 3, a charging control circuit 302 is used for monitoring whether the voltage value of the external power is less than the predetermined value. If the voltage value of the external power is less than the predetermined value, the charging control circuit 302 stops charging the electrical storage device 106, and outputs the control signal CS to a power control circuit 304 for controlling the power control circuit 304 to output the backup power CP via the I/O interface 102.

In the embodiment of FIG. 3, the power control circuit 304 includes the power conversion circuit 112 and an output control circuit 306. The power conversion circuit 112 is used for converting the stored power into the backup power CP, and converting the stored power into the power required by the elements within the internal power-consuming device 116. The output control circuit 306 receives the backup power CP, and is controlled by the control signal CS for outputting the backup power CP via the I/O interface 102 when the voltage value of the external power is less than the predetermined value.

Certainly, the output control circuit 306 can be designed to stabilize the voltage and the current of the backup power CP, so that the charging voltage and the charging current of the electronic apparatus can be stabilized. Moreover, the charging control circuit 302 can be designed to stop charging the electrical storage device 106 after the electrical storage device 106 is fully charged, or the charging control circuit 302 can be designed to have an over current protection function.

Figure 4:
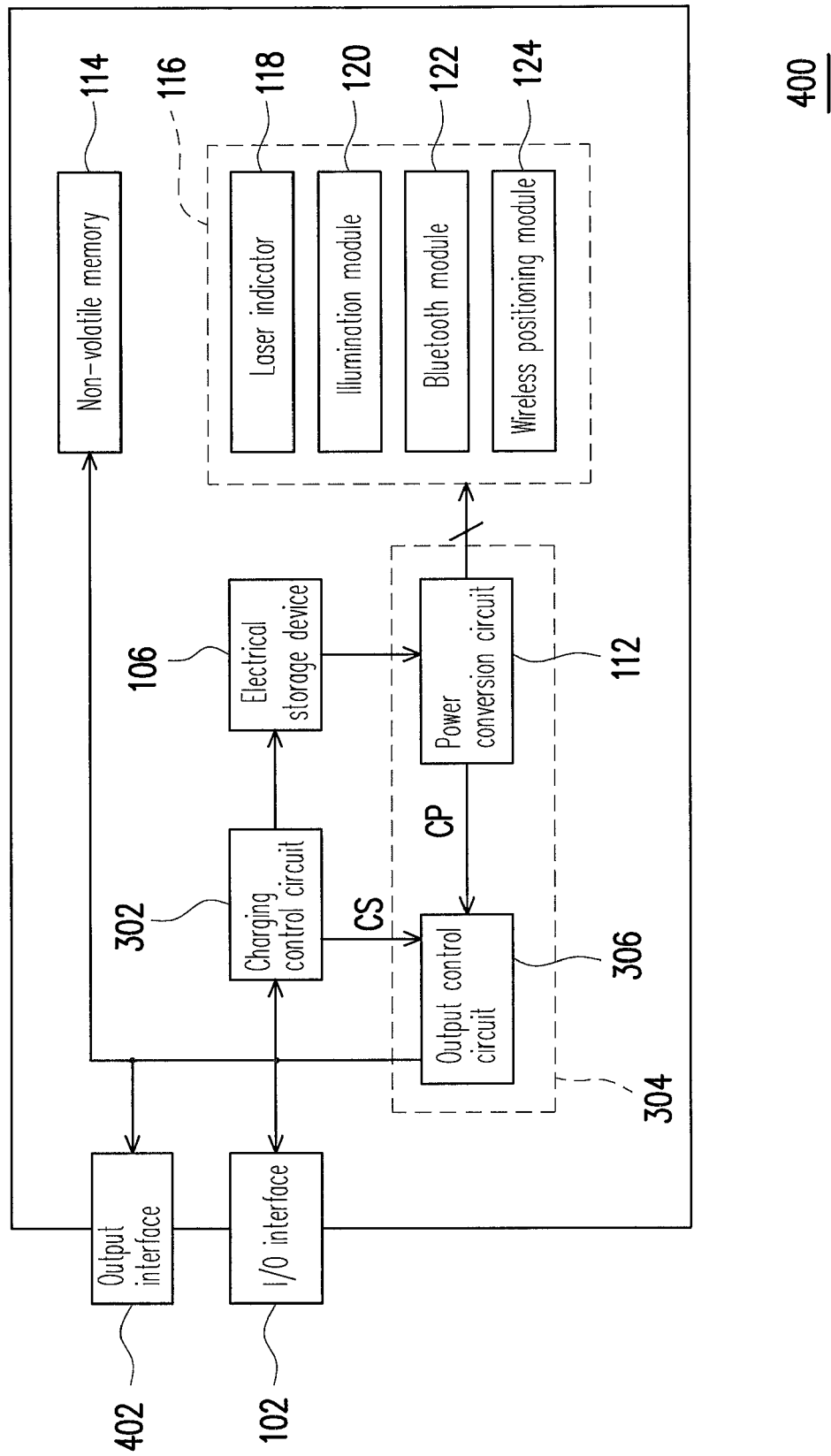
FIG. 4 is a diagram illustrating a non-volatile memory device capable of supplying power according to yet another embodiment of the present invention.

Considering that the non-volatile memory device 300 can be used for charging two different electronic apparatus, the present invention provides yet another non-volatile memory device, as shown in FIG. 4. FIG. 4 is a diagram illustrating a non-volatile memory device capable of supplying power according to yet another embodiment of the present invention. Referring to FIG. 3 and FIG. 4, a difference between the two non-volatile memory devices is that the non-volatile memory device 400 of FIG. 4 has an additional output interface 402.

In summary, in the present invention, the electrical storage device used for supplying the stored power, the charging control circuit and the power control circuit are applied in the non-volatile memory device, and the I/O interface can transmit the external power output from the electronic apparatus to the charging control circuit, so that the charging control circuit could control the charging current and the charging voltage of the electrical storage device. The power control circuit is used for converting the stored power in to the backup power. Moreover, the charging control circuit and the power control circuit are utilized for controlling charging/discharging of the electrical storage device, and monitoring whether the voltage value of the external power is less than the predetermined value. Once the voltage value of the external power is less than the predetermined value, the charging control circuit stops charging the electrical storage device, and the power control circuit outputs the backup power through the I/O interface, so as to supply power to the external electronic apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory device capable of supplying power, comprising:
  a non-volatile memory;
  an electrical storage device, for providing a stored power;
  a charging control circuit, coupled to the electrical storage device;
  an input/output (I/O) interface, for connecting a first electronic apparatus for data transmitting, and transmitting an external power output from the first electronic apparatus to the non-volatile memory and the charging control circuit, so that the charging control circuit can control a charging current and a charging voltage of the electrical storage device; and a power control circuit, for converting the stored power into a backup power and monitoring whether a voltage value of the external power is less than a predetermined value, and controlling the charging control circuit to stop charging the electrical storage device and outputting the backup power via the I/O interface when the voltage value of the external power is less than the predetermined value.

2. The non-volatile memory device capable of supplying power as claimed in claim 1, wherein the power control circuit comprises:

a power conversion circuit, for converting the stored power into the backup power; and an output control circuit, for receiving the backup power and monitoring whether the voltage value of the external power is less than the predetermined value, and controlling the charging control circuit to stop charging the electrical storage device and outputting the backup power via the I/O interface when the voltage value of the external power is less than the predetermined value.

3. The non-volatile memory device capable of supplying power as claimed in claim 2, wherein the power conversion circuit is a DC/DC converter.

4. The non-volatile memory device capable of supplying power as claimed in claim 2, wherein the output control circuit further stabilizes a voltage and a current of the backup power.

5. The non-volatile memory device capable of supplying power as claimed in claim 1, wherein the charging control circuit stops charging the electrical storage device after the electrical storage device is fully charged.

6. The non-volatile memory device capable of supplying power as claimed in claim 1, wherein the charging control circuit further has an over current protection function.

7. The non-volatile memory device capable of supplying power as claimed in claim 1 further comprising:

an output interface, coupled to the I/O interface, the non-volatile memory, the charging control circuit and the power control circuit, for connecting a second electronic apparatus, so as to output the backup power to the second electronic apparatus.

8. The non-volatile memory device capable of supplying power as claimed in claim 1, wherein the I/O interface is implemented by a universal serial bus (USB) interface, a personal computer memory card international association (PCMCIA) interface, a compact flash (CF) card interface, a secure digital (SD) memory card interface, or a multimedia memory card (MMC) interface.

9. The non-volatile memory device capable of supplying power as claimed in claim 1, wherein the electrical storage device is implemented by a rechargeable battery.

10. The non-volatile memory device capable of supplying power as claimed in claim 9, wherein the electrical storage device is implemented by an ultracapacitor.

11. The non-volatile memory device capable of supplying power as claimed in claim 1, wherein the non-volatile memory is implemented by a flash memory.

12. The non-volatile memory device capable of supplying power as claimed in claim 11, wherein the non-volatile memory is implemented by a NAND flash memory.

13. The non-volatile memory device capable of supplying power as claimed in claim 11, wherein the non-volatile memory is implemented by a NOR flash memory.

14. The non-volatile memory device capable of supplying power as claimed in claim 1 further comprising at least one of a laser indicator, an illumination module, a bluetooth module and a wireless positioning module, wherein power required by the laser indicator, the illumination module, the bluetooth module and the wireless positioning module are all obtained by converting the stored power via the power control circuit.

15. A non-volatile memory device capable of supplying power, comprising:

a non-volatile memory;

an electrical storage device, for providing a stored power;

a charging control circuit, coupled to the electrical storage device;

an input/output (I/O) interface, for connecting a first electronic apparatus for data transmitting, and transmitting an external power output from the first electronic apparatus to the non-volatile memory and the charging control circuit, so that the charging control circuit can control a charging current and a charging voltage of the electrical storage device; and a power control circuit, for converting the stored power into a backup power, wherein the charging control circuit further monitors whether a voltage value of the external power is less than a predetermined value, and when the voltage value of the external power is less than the predetermined value, the charging control circuit stops charging the electrical storage device, and controls the power control circuit to output the backup power via the I/O interface.

16. The non-volatile memory device capable of supplying power as claimed in claim 15, wherein the power control circuit comprises:

a power conversion circuit, for converting the stored power into the backup power; and an output control circuit, for receiving the backup power, and being controlled by the charging control circuit, so as to output the backup power via the I/O interface when the voltage value of the external power is less than the predetermined value.

17. The non-volatile memory device capable of supplying power as claimed in claim 16, wherein the power conversion circuit is a DC/DC converter.

18. The non-volatile memory device capable of supplying power as claimed in claim 16, wherein the output control circuit further stabilizes a voltage and a current of the backup power.

19. The non-volatile memory device capable of supplying power as claimed in claim 15, wherein the charging control circuit stops charging the electrical storage device after the electrical storage device is fully charged.

20. The non-volatile memory device capable of supplying power as claimed in claim 15, wherein the charging control circuit further has an over current protection function.

21. The non-volatile memory device capable of supplying power as claimed in claim 15 further comprising:

an output interface, coupled to the I/O interface, the non-volatile memory, the charging control circuit and the power control circuit, for connecting a second electronic apparatus, so as to output the backup power to the second electronic apparatus.

22. The non-volatile memory device capable of supplying power as claimed in claim 15, wherein the I/O interface is implemented by a universal serial bus (USB) interface, a personal computer memory card international association (PCMCIA) interface, a compact flash (CF) card interface, a secure digital (SD) memory card interface, or a multimedia memory card (MMC) interface.

23. The non-volatile memory device capable of supplying power as claimed in claim 15, wherein the electrical storage device is implemented by a rechargeable battery.

24. The non-volatile memory device capable of supplying power as claimed in claim 23, wherein the electrical storage device is implemented by an ultracapacitor.

25. The non-volatile memory device capable of supplying power as claimed in claim 15, wherein the non-volatile memory is implemented by a flash memory.

26. The non-volatile memory device capable of supplying power as claimed in claim 25, wherein the non-volatile memory is implemented by a NAND flash memory.

27. The non-volatile memory device capable of supplying power as claimed in claim 25, wherein the non-volatile memory is implemented by a NOR flash memory.

28. The non-volatile memory device capable of supplying power as claimed in claim 15 further comprising at least one of a laser indicator, an illumination module, a bluetooth module and a wireless positioning module, wherein power required by the laser indicator, the illumination module, the bluetooth module and the wireless positioning module are all obtained by converting the stored power via the power control circuit.

* * * * *